US007326624B2

(12) United States Patent
Osaki et al.

(10) Patent No.: US 7,326,624 B2
(45) Date of Patent: Feb. 5, 2008

(54) METHOD OF MAKING THIN-FILM CHIP RESISTOR

(75) Inventors: Nobuo Osaki, Kyoto (JP); Masanori Tanimura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 250 days.

(21) Appl. No.: 11/055,027

(22) Filed: Feb. 9, 2005

(65) Prior Publication Data

US 2005/0204547 A1 Sep. 22, 2005

(30) Foreign Application Priority Data

Feb. 9, 2004 (JP) ............................. 2004-032437
Feb. 9, 2004 (JP) ............................. 2004-032438

(51) Int. Cl.
*H01L 21/20* (2006.01)

(52) U.S. Cl. ....................... 438/384; 438/381; 438/382

(58) Field of Classification Search ................ 438/381, 438/382, 384
See application file for complete search history.

(56) References Cited

U.S. PATENT DOCUMENTS 5,976,944 A * 11/1999 Czagas et al. .............. 438/382
6,292,091 B1 9/2001 Kambara et al.
6,322,711 B1 * 11/2001 Chen ........................... 216/16
2002/0026706 A1 * 3/2002 Kurita ....................... 29/610.1
2004/0126704 A1 * 7/2004 Werner et al. .............. 430/311

FOREIGN PATENT DOCUMENTS

JP 2001-35702 2/2001

* cited by examiner

*Primary Examiner*—Zandra V. Smith
*Assistant Examiner*—Bac H. Au
(74) *Attorney, Agent, or Firm*—Hamre, Schumann, Mueller & Larson, P.C.

(57) ABSTRACT

A method of making a thin-film chip resistor includes: a step of making a material plate A formed with lengthwise breaking grooves A1 and crosswise breaking grooves A2 along which the plate is to be divided into individual chip substrates 1 each to become a chip resistor; and a step of forming a film of resistive element material B by a thin-film process such as spattering, on a surface of the material plate A. The step of thin-film process, in which the resistive element material B is formed, is performed with a masking sheet E placed on the surface of the material plate A, covering only regions including the lengthwise breaking grooves A1 and the crosswise breaking grooves A2.

3 Claims, 16 Drawing Sheets

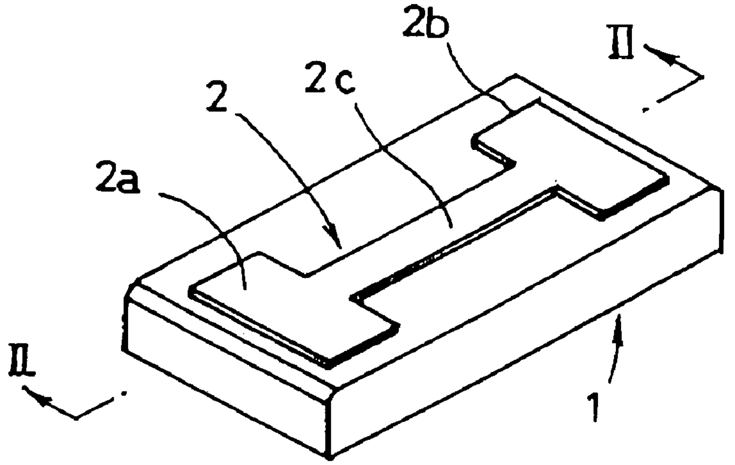
Fig 1
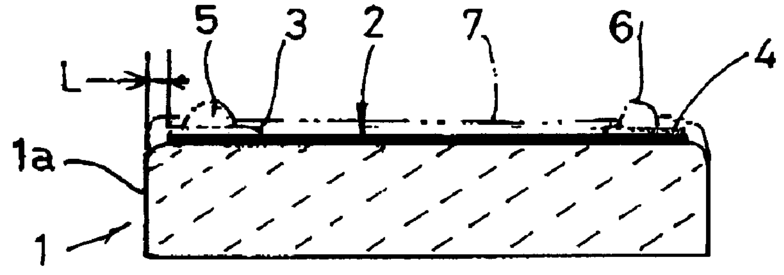
Fig.2-a
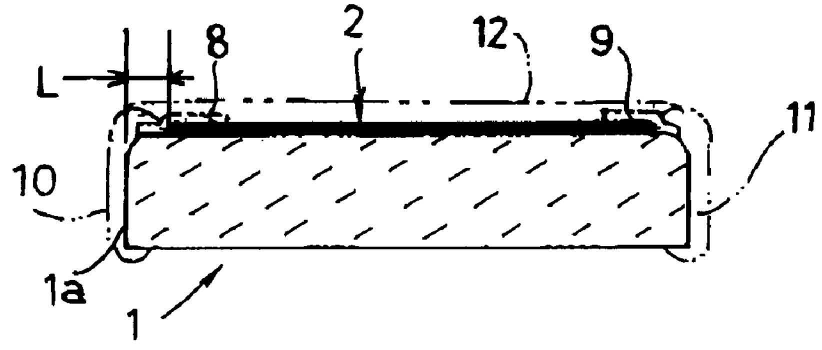
Fig.2-b

METHOD OF MAKING THIN-FILM CHIP RESISTOR

TECHNICAL FIELD

The present invention relates to a method of making a chip resistor which includes a thin-film resistive element formed by a thin-film process such as spattering and vacuum deposition on a chip substrate provided by a heat resistant insulation material.

BACKGROUND ART

A thin-film chip resistor of this kind is disclosed in JP-A 2001-35702 for example, and has a construction as shown in FIG. 1 of the present application. Specifically, the chip resistor includes a chip substrate 1 made of a heat resistant insulation material such as ceramic, which has a surface provided with a thin-film resistive element 2 formed by a thin-film process such as spattering. The resistive element 2 is patterned to have two wide ends 2*a*, 2*b* sandwiching a narrow intermediate portion 2*c*.

The thin-film chip resistor can be of a type shown in FIG. 2-*a* or a type shown in FIG. 2-*b*. Specifically, in the type shown in FIG. 2-*a,* the resistive element 2 has its two wide ends 2*a*, 2*b* formed with surface electrodes 3, 4 respectively. The electrodes 3, 4 have their surfaces formed with connection bumps 5, 6 respectively, and the resistive element 2 is covered with a cover coat 7. On the other hand, in the type shown in FIG. 2-*b,* the resistive element 2 has its two wide ends 2*a*, 2*b* formed with surface electrodes 8, 9, the chip substrate 1 has its two end surfaces formed with connection terminal electrodes 10, 11 respectively, and the resistive element 2 is covered with a cover coat 12.

Generally, these conventional thin-film chip resistors are made in the following method. Specifically:

i) First, as shown in FIG. 3 and FIG. 4, a material plate A is prepared which has a surface provided with lengthwise breaking grooves A1 and crosswise breaking grooves A2 for breakage into a plurality of chip substrates 1.

ii) Next, the material plate A is placed into a sealed container, and a thin-film process is performed to the material surface by means of spattering or vacuum deposition, using a resistive element material as a target. In this process, a thin film of the resistive element material B is formed as shown in FIG. 5, covering the entire surface of the material plate A.

iii) Next, as shown in FIG. 6, a negative resist film C is formed to cover the entire surface of the resistive element material thin film B. On this resist film C, a photo mask D is placed which has stencil patterns D1 (photographically transparent openings) each for shaping a resistive element 2 on one of the chip substrates 1. The pattern is printed through a photochemical exposure process.

iv) Next, a developing process is performed, in which the resist film C is soaked into a developing solution. In this process, as shown in FIG. 7, the resist film C is removed except for the portion patterned into the shape of resistive element 2 on each chip substrate 1.

v) Next, an etching process is performed in an etchant which is capable of removing the thin film of resistive element material B. In this process, as shown in FIG. 8, portions of the resistive element material B which are not covered with the resist film C are dissolved and thereby removed, leaving beneath the resist film C resistive elements 2 which are patterned into a predetermined shape.

vi) Next, as shown in FIG. 9, the resist film C is removed by dry ashing or etching in solution, and then the material plate A is cut along the lengthwise breaking grooves A1 and the crosswise breaking grooves A2 into a plurality of chip substrates 1.

As described, in the conventional method, the lengthwise breaking grooves A1 and the crosswise breaking grooves A2 are formed in advance, then a resistive element material B is formed by spattering or vacuum deposition on the entire surface of the material plate A, the resistive element material B is then masked with a resist film C for a photo etching process to form a predetermined pattern of resistive elements 2, and then the material plate A is cut along each of the breaking grooves A1, A2, into a plurality of chip substrates 1.

According to the conventional method, however, during the formation of resistive element material B on the surface of the material plate A by means of spattering or vacuum deposition, the spattering or the vacuum deposition process unavoidably forms a film of the resistive element material B in the breaking grooves A1, A2 which are already made in the surface of the material plate A. Thus, it is necessary in the etching process that follows, to remove the deposit of resistive element material B completely from the breaking grooves A1, A2 as part of the unnecessary portions. If this etching process leaves the resistive element material B in the breaking grooves A1, A2, it becomes difficult to cut the material plate A into each individual chip substrate 1. Moreover, the residue causes another problem in a step which must be done before the cutting. Specifically, there is a step called trimming adjustment, in which two electrical probes are placed onto respective ends of the resistive element 2 and trimming is made to the element while measuring a resistance value. If the resistive element material B is left in the breaking grooves A1, A2, it becomes impossible to obtain an accurate resistance value, which not only decreases accuracy of the trimming adjustment but also results in poor yield of the product.

Another problem is that even after the material plate A has been cut along the breaking grooves A1, A2, the portions which used to be the breaking grooves A1, A2 still carry the resistive element material. After forming the connection terminal electrodes 10, 11, when forming a layer of plating as shown in FIG. 2-*b,* on surfaces of these connection terminal electrodes 10, 11 for improved soldering, the residue of resistive element material is a cause of poor plating.

The resistive element material B formed in a thin-film process such as spattering grows deep into the breaking grooves A1, A2, and the film has a much greater thickness in these regions. Therefore, in order to remove the resistive element material B completely from the breaking grooves A1, A2 by etching, a long time must be provided for the etching.

Spending a long time for the etching causes a number of problems: it increases cost of manufacturing. It increases a risk that the etching process will erode the underside of the resist film C and thereby destroy the predetermined pattern of the resistive element 2. It also increases a risk that the resist film C will also be eroded by the etchant, and pin holes will be made in the resistive element 2, causing the resistance value becoming far away from an acceptable range, and resulting in increased rate of defective products.

DISCLOSURE OF THE INVENTION

It is therefore a technical object of the present invention to provide a method capable of solving these problems.

A first aspect of the present invention provides a method of making a thin-film chip resistor. The method includes: a step of preparing a material plate having a surface provided with lengthwise breaking grooves and crosswise breaking grooves for cutting the plate into a plurality of chip substrates; a step of placing on the material plate a masking sheet which has stencil patterns each for shaping a resistive element on one of the chip substrates and covers the lengthwise breaking grooves and the crosswise breaking grooves; and a step of forming the resistive elements by means of a thin-film process on the surface of the material plate with the masking sheet placed thereon.

According to this method, the step of forming a resistive element on the surface of the material plate is performed with the masking sheet covering the lengthwise breaking grooves and the crosswise breaking grooves. Therefore, it is possible to prevent the resistive element material from depositing in the lengthwise breaking grooves and the crosswise breaking grooves, or to reduce the deposition. As a result, it becomes possible to eliminate the etching process necessary for shaping the resistive element into a predetermined pattern, and to reduce manufacturing cost as well as a rate of defective products dramatically.

A second aspect of the present invention provides a method of making a thin-film chip resistor. The method includes: a step of preparing a material plate having a surface provided with lengthwise breaking grooves and crosswise breaking grooves for cutting the plate into a plurality of chip substrates; a step of forming a thin film of resistive element on the surface of the material plate; a step of forming a resist film on the surface of the material plate; a step of etching the resist film into patterns each for shaping the resistive element on one of the chip substrates; a step of removing remaining portions of the resist film; and a step of cutting the material plate into each individual chip substrate. During the step of forming a film of resistive element, a masking sheet covering the lengthwise breaking grooves and the crosswise breaking grooves is placed on the material plate.

According to this method, during the step of forming the resistive element, the masking sheet prevents the resistive element from forming in the lengthwise breaking grooves and the crosswise breaking grooves, or reduces the formation. This shortens the time necessary for the etching that follows, making possible to dramatically reduce a rate of defective products rejected for such reasons as the resistive element of a destroyed pattern and the resistive element with pin holes. Further, combination of reduced time for the etching and reduced rate of defective products enable to reduce manufacturing cost dramatically.

A specific advantage according to the second method is that the resistive element can be patterned by photo etching with a resist film, and therefore it is possible to make more finely patterned resistive elements.

Preferably, in the first or the second aspect, a region in the masking sheet covering the lengthwise breaking grooves and the crosswise breaking grooves has a width 1.1 through 4 times a width of the lengthwise breaking grooves and of the crosswise breaking grooves.

Preferably, in the first or the second aspect, the masking sheet is nonmagnetic.

A third aspect of the present invention provides a method of making a thin-film chip resistor. The method includes: a step of preparing a material plate having a surface provided with lengthwise breaking grooves and crosswise breaking grooves for cutting the plate into a plurality of chip substrates; a step of forming a resist film on the surface of the material plate, covering at least regions each corresponding to one of the chip substrates, as well as the lengthwise breaking grooves and the crosswise breaking grooves; a step of forming in the resist film stencil patterns each for shaping the resistive element on one of the chip substrates; a step of forming the resistive elements on the surface of the material plate by means of a thin-film process; a step of removing the resist film; and a step of cutting the material plate into each individual chip substrate.

According to this method, before the step of thin-film process such as spattering, the surface of the material plate is formed with a resist film, which enables to form a predetermined pattern of the resistive element on each chip substrate without forming the resistive element material in the lengthwise breaking grooves and crosswise breaking grooves of the material plate. This enables to eliminate the etching step which is necessary in the conventional method, and therefore to reduce a rate of defective products as well as manufacturing cost dramatically.

A fourth aspect of the present invention provides a method of making a thin-film chip resistor. The method includes: a step of preparing a material plate having a surface provided with lengthwise breaking grooves and crosswise breaking grooves for cutting the plate into a plurality of chip substrates; a step of forming a thin film of resistive element on the surface of the material plate by means of a thin-film process; a step of forming a resist film on the surface of the material plate; a step of etching the resist film into patterns each for shaping the resistive element on one of the chip substrates; a step of removing remaining portions of the resist film; and a step of cutting the material plate into each individual chip substrate. In addition, the method further includes: a step of forming a removable filler in at least apart of the surface of the material plate including the lengthwise breaking grooves and the crosswise breaking grooves to fill each of the breaking grooves before the step of forming the resistive element; and a step of removing the filler after the step of forming the resistive element.

According to this method described above, it is possible to prevent the resistive element material from being formed in the lengthwise breaking grooves and the crosswise breaking grooves in the thin-film process, by first forming a removable filler in at least a part of the surface of the material plate including the lengthwise breaking grooves and the crosswise breaking grooves thereby filling each of the breaking grooves before the step thin-film process in which the resistive element material is formed on the surface of material plate, and then removing the filler after the step of thin-film process such as spattering. This enables to avoid the prolongation of the etching time, to shorten the etching time, and therefore to reduce a rate of defective products due to unsuccessful etching process as well as to reduce cost increase in manufacture.

Preferably, the filler is provided by a resist film.

Other objects, characteristics and advantages of the present invention will become clearer from the following description of embodiments to be made with reference to the accompanying drawings.

BRIEF DESCRIPTION OF THE DRAWINGS

FIG. 1 is a perspective view of a chip resistor.

FIG. 2 is an enlarged sectional view taken in lines II-II in FIG. 1.

BEST MODE FOR CARRYING OUT THE INVENTION

Hereinafter, modes of embodying the present invention will be described with reference to the drawings.

Among the drawings, FIG. 10 through FIG. 13 show steps of a method according to a first mode of embodiment.

The method according to the first mode of embodiment includes, as does the conventional method, a step of preparing a material plate A (see FIG. 10) which has a surface provided with lengthwise breaking grooves A1 and crosswise breaking grooves A2 for the purpose of cutting the substrate into a plurality of chip substrates 1. The lengthwise breaking grooves A1 and the crosswise breaking grooves A2 can be formed simultaneously when the material plate A is manufactured. Alternatively, the material plate A may not be formed with the lengthwise breaking grooves A1 and the crosswise breaking grooves A2 at the time of manufacture, and the lengthwise breaking grooves A1 and the crosswise breaking grooves A2 may be formed later using laser beams for example, on the surface of the material plate A.

Figure 10:
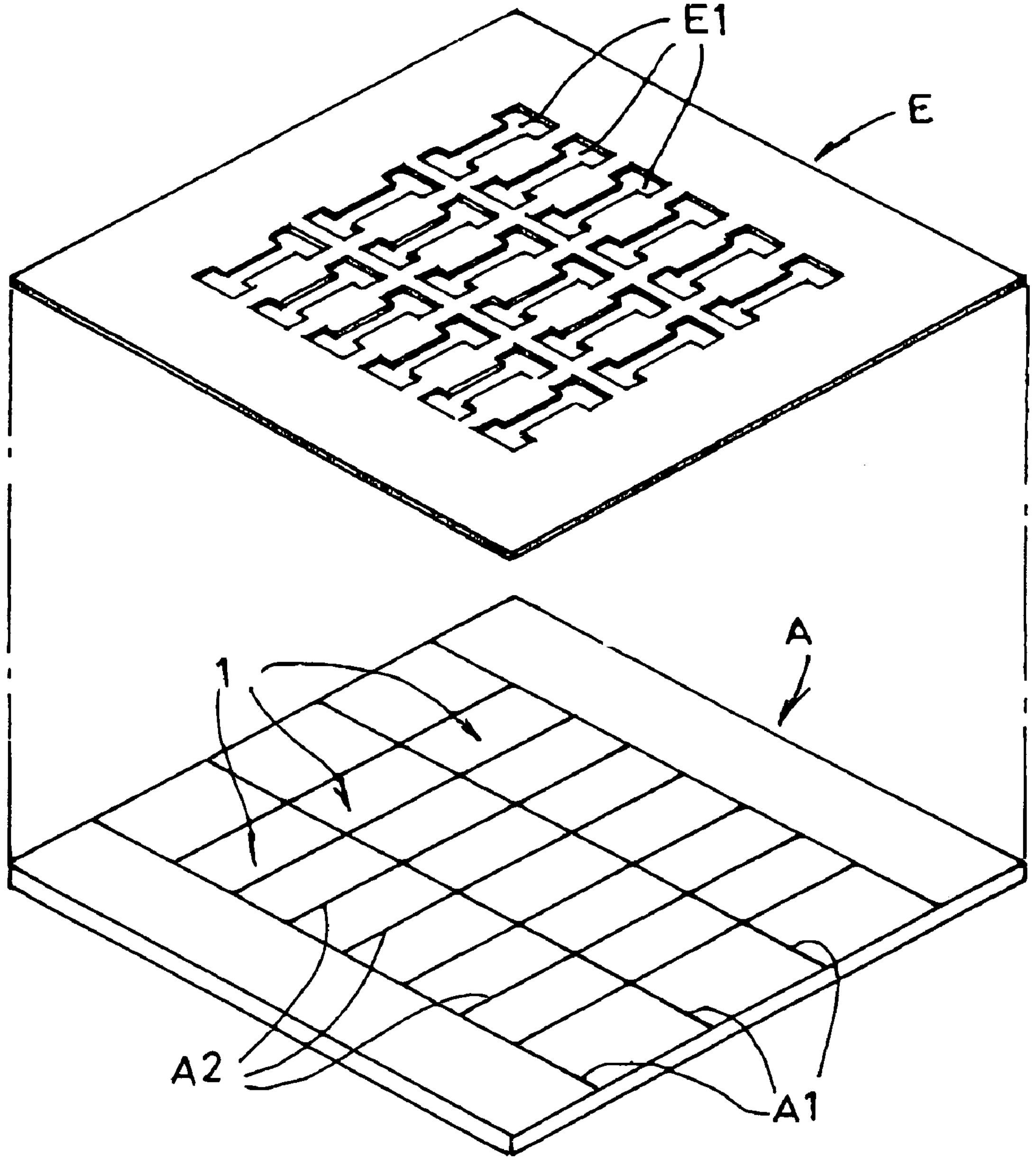
FIG. 10 is a perspective view showing the first step according to the first mode of embodiment of the present invention.

Separately from the material plate A, a masking sheet E is prepared, which has the same size as the material plate A and is made of a nonmagnetic material such as stainless steel (See FIG. 10). The masking sheet E is formed with stencil patterns E1 each having a shape of a resistive element 2 (See FIG. 1) at a place corresponding to one of the chip substrates 1.

Figure 11:
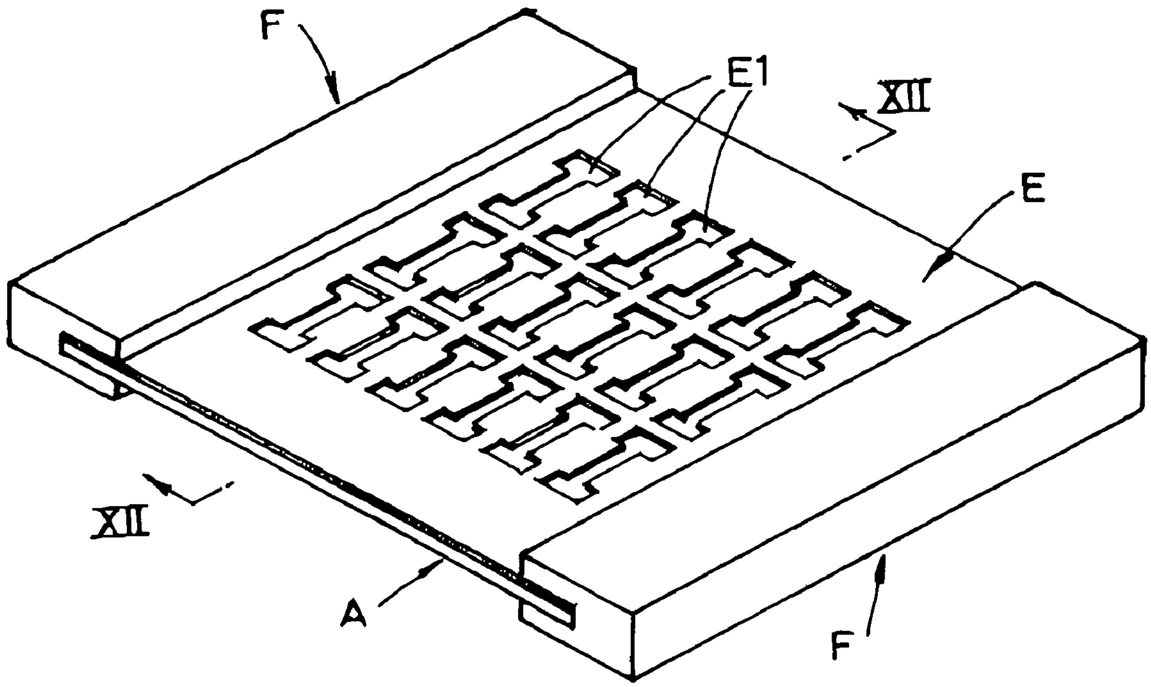
FIG. 11 is a perspective view showing the second step according to the first mode of embodiment of the present invention.
Figure 12:
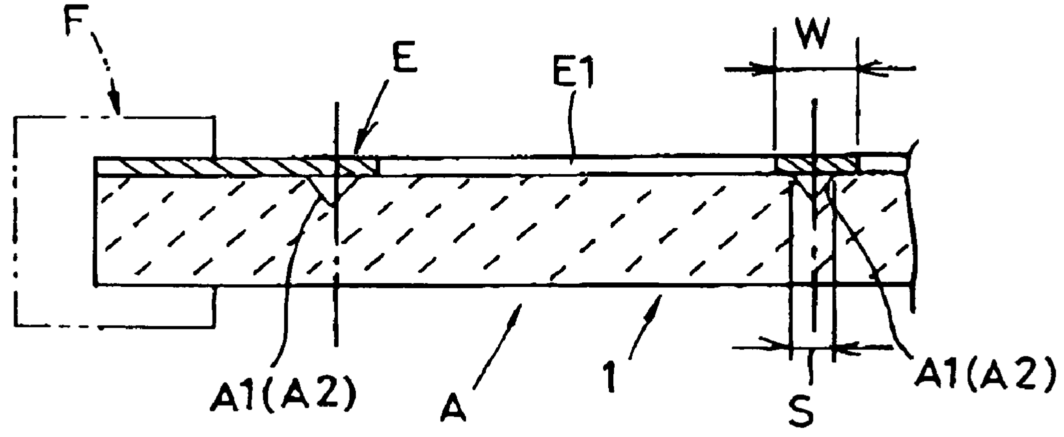
FIG. 12 is an enlarged sectional view taken in lines XII-XII in FIG. 11.

Next, as shown in FIG. 11 and FIG. 12, the masking sheet E is placed onto the material plate A, so that a region of the surface on the material plate A formed with the breaking grooves A1 and the crosswise breaking grooves A2 is masked by the masking sheet E. While masking the region, the masking sheet E placed on the material plate A is fixed to the material plate A immovably in crosswise directions, using e.g. a pair of detachable clips F provided at its right and left ends.

Figure 13:
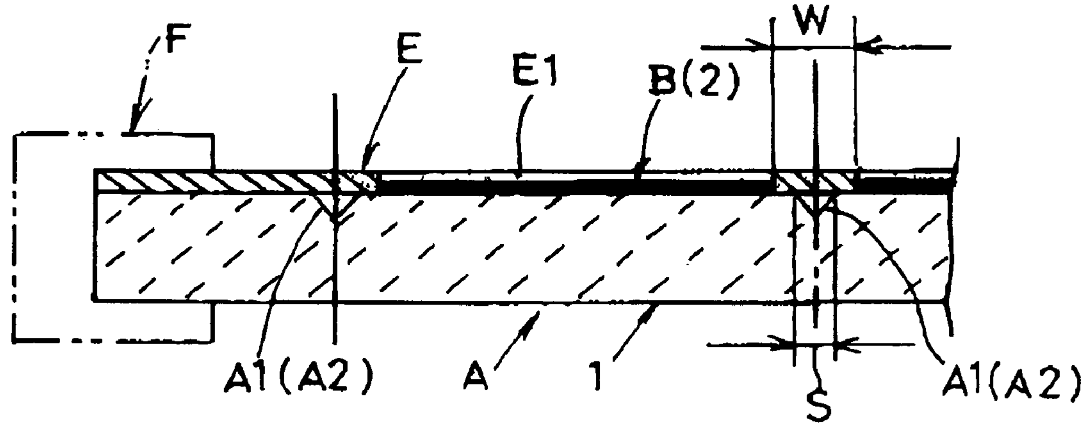
FIG. 13 is a sectional view showing the third step according to the first mode of embodiment of the present invention.

Next, as shown in FIG. 13, the assembly composed of the material plate A, the masking sheet E and the clips F is placed in a sealed container, and a thin-film process is performed to the surface of the material plate A by means of spattering or vacuum deposition, using a target provided by a resistive element material B. As a result, a resistive element 2 provided by the resistive element material B is formed in each of the stencil patterns E1, on the surface of the material plate A. In this step, the masking sheet E covers the lengthwise breaking grooves A1 and the crosswise breaking grooves A2 in the material plate A, so it is possible to prevent or reduce deposition of the resistive element material B in these grooves.

After the thin-film process is over, the masking sheet E is removed, and then the material plate A is cut along the lengthwise breaking grooves A1 and crosswise breaking grooves A2 into a plurality of individual chip substrates 1.

If the chip resistor being made is of a type shown in FIG. 2-*b,* the cutting of the material plate A into individual chip substrates 1 is made in the following steps. Specifically, first, surface electrodes 8, 9 are formed in each resistive element 2. Next, cutting is made along the lengthwise breaking grooves A1, thereby cutting the material plate A into a plurality of bar members. Next, connection terminal electrodes 10, 11 are formed on respective side surfaces of each of the bar members. Finally, the bar members are cut along the crosswise breaking grooves A2, into individual chip substrates 1.

Next, FIG. 14 through FIG. 19 show steps of a method according to a second mode of embodiment.

The method according to the second mode of embodiment includes, as does according to the first mode of embodiment, a step of preparing a material plate A (see FIG. 14) which has a surface provided with lengthwise breaking grooves A1 and crosswise breaking grooves A2 for the purpose of cutting the substrate into a plurality of chip substrates 1. The lengthwise breaking grooves A1 and the crosswise breaking grooves A2 can be formed simultaneously when the material plate A is manufactured. Alternatively, the material plate A may not be formed with the lengthwise breaking grooves A1 and the crosswise breaking grooves A2 at the time of manufacture, and the lengthwise breaking grooves A1 and the crosswise breaking grooves A2 may be formed later using laser beams for example, on the surface of the material plate A.

Figure 14:
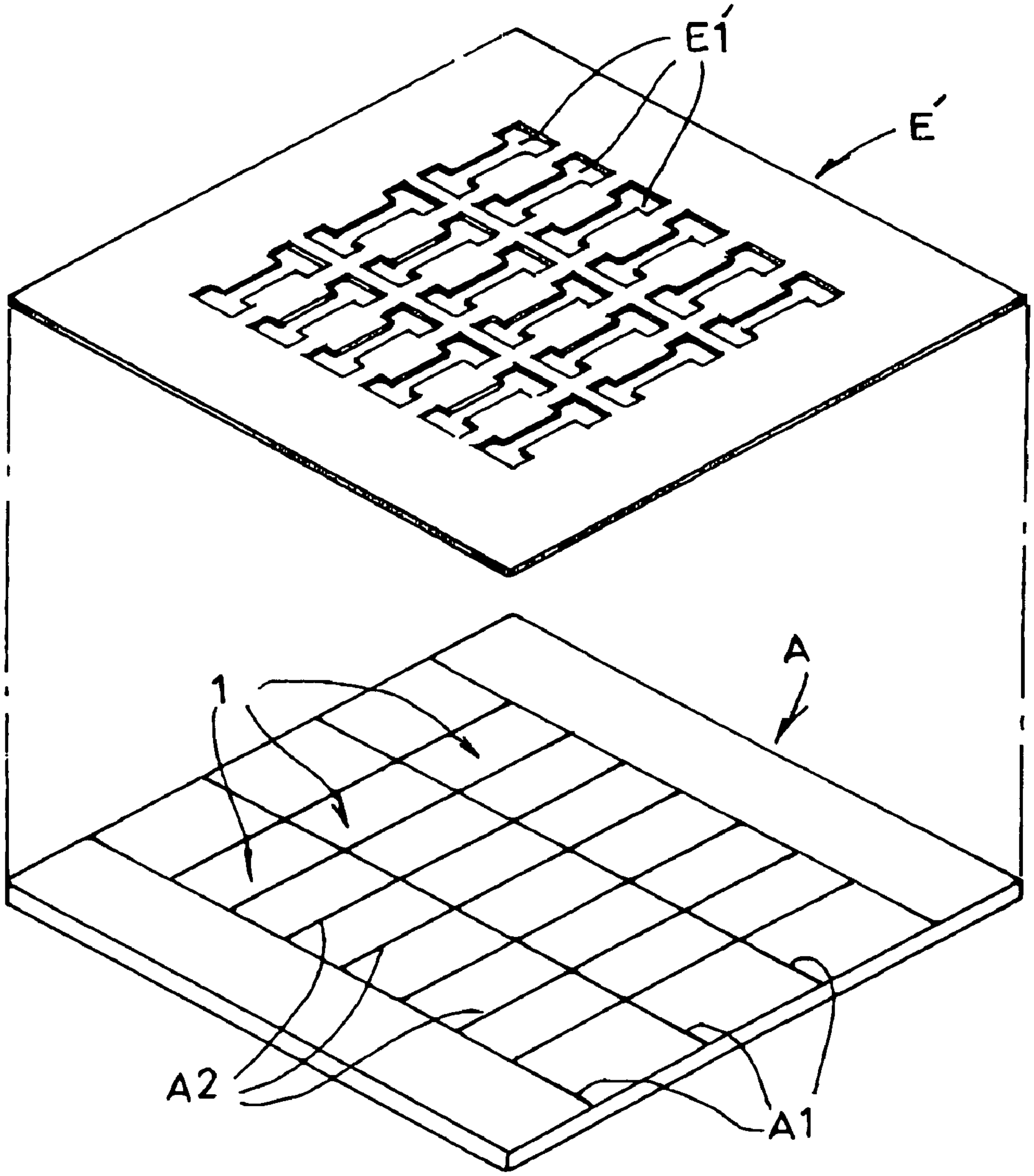
FIG. 14 is a perspective view showing the first step according to the second mode of embodiment of the present invention.

Separately from the material plate A, a masking sheet E' is prepared, which has the same size as the material plate A and is made of a nonmagnetic material such as stainless steel (See FIG. 14). The masking sheet E' is formed with stencil patterns E1' each at a place corresponding to one of the chip substrates 1. Each of the stencil patterns E1' is large enough to surround a corresponding resistive element 2 (See FIG. 1), and is shaped into a figure similar to the resistive element 2 for example.

Figure 15:
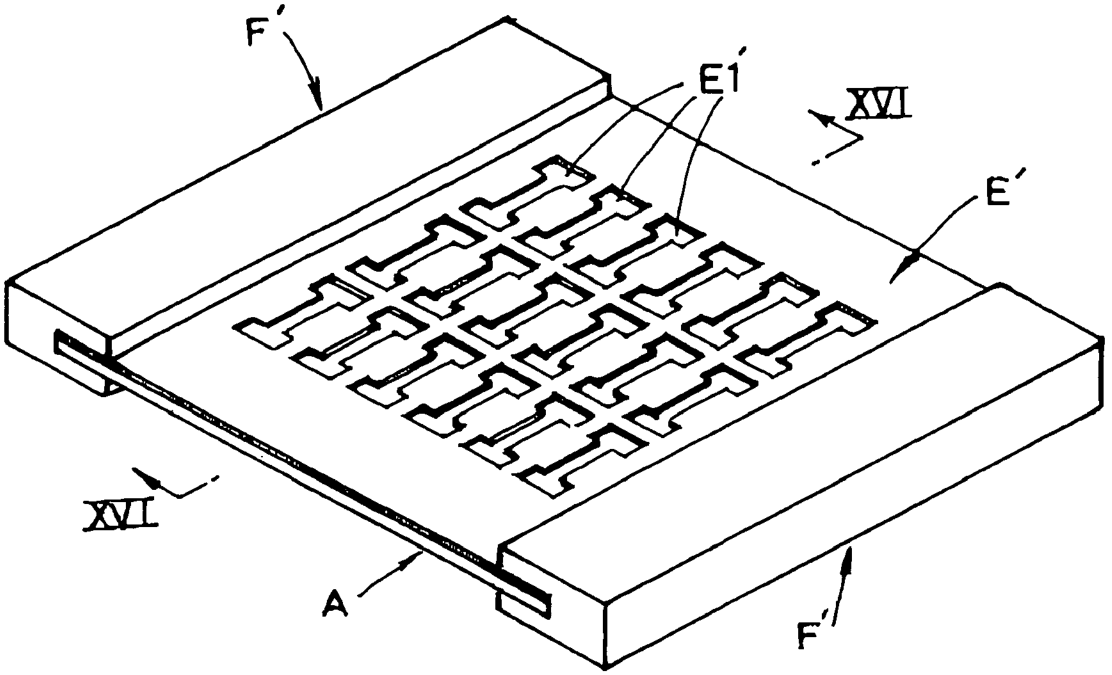
FIG. 15 is a perspective view showing the second step according to the second mode of embodiment of the present invention.
Figure 16:
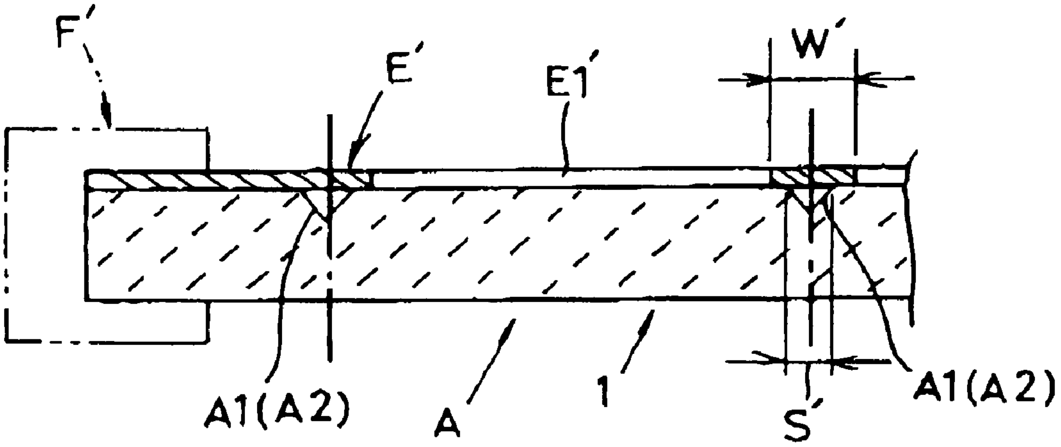
FIG. 16 is an enlarged sectional view taken in lines XVI-XVI in FIG. 15.

Next, as shown in FIG. 15 and FIG. 16, the masking sheet E' is placed onto the material plate A, so that a region on the surface of the material plate A formed with the breaking grooves A1 and the crosswise breaking grooves A2 is masked by the masking sheet E'. While masking the region, the masking sheet E' placed on the material plate A is fixed to the material plate A immovably in crosswise directions, using e.g. a pair of detachable clips F' provided at its right and left ends.

Figure 17:
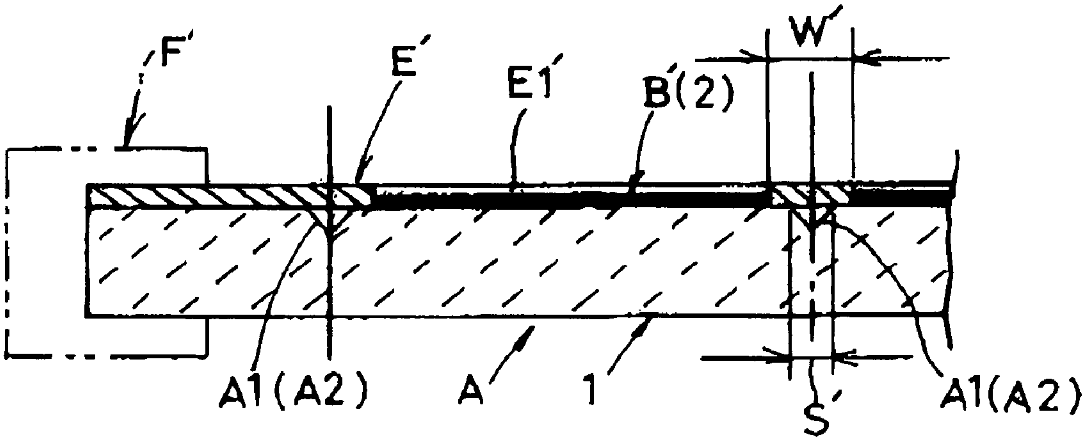
FIG. 17 is a perspective view showing the third step according to the second mode of embodiment of the present invention.

Next, as shown in FIG. 17, the assembly composed of the material plate A, the masking sheet E' and the clips F' is placed in a sealed container, and a thin-film process is performed to the surface of the material plate A by means of spattering or vacuum deposition, using a target provided by a resistive element material B'. As a result, a predetermined pattern of the resistive element 2 provided by the resistive element material B is formed in each of the stencil patterns E1 of the masking sheet E, on the surface of the material plate A. In this step, the masking sheet E covers the lengthwise breaking grooves A1 and the crosswise breaking grooves A2 in the material plate A, so it is possible to prevent or reduce deposition of the resistive element material B in these grooves.

Figure 3:
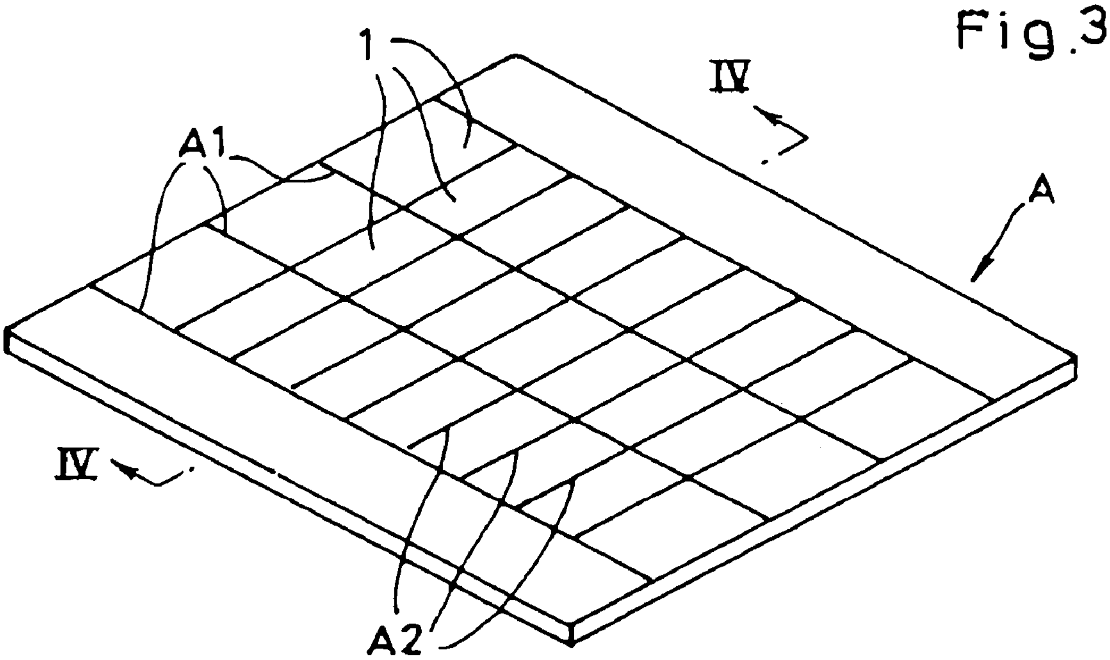
FIG. 3 is a perspective view of a material plate used in making the chip resistor.
Figure 4:
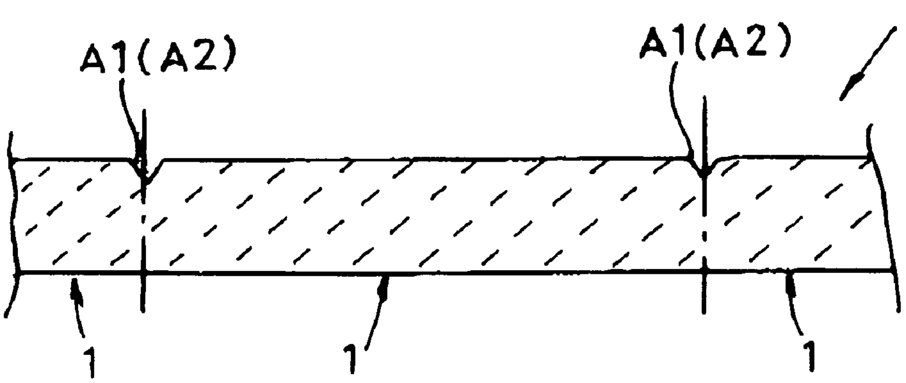
FIG. 4 is an enlarged sectional view taken in lines IV-IV in FIG. 3.
Figure 5:
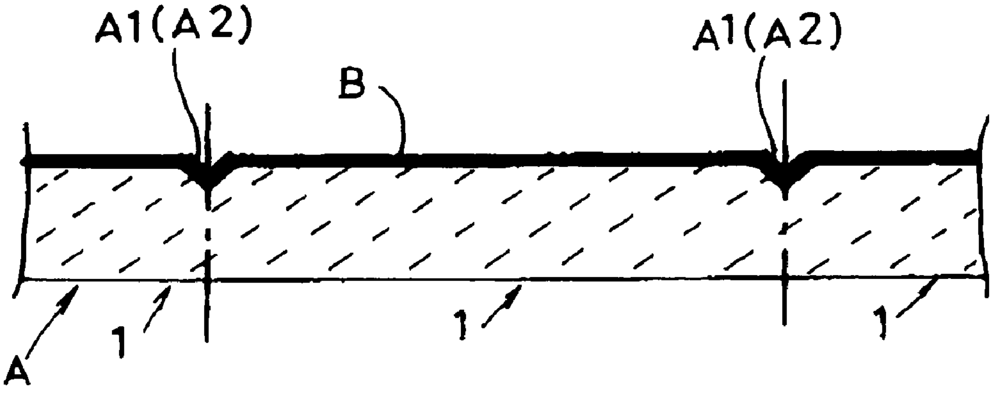
FIG. 5 is a sectional view showing the first step according to the conventional method.
Figure 6:
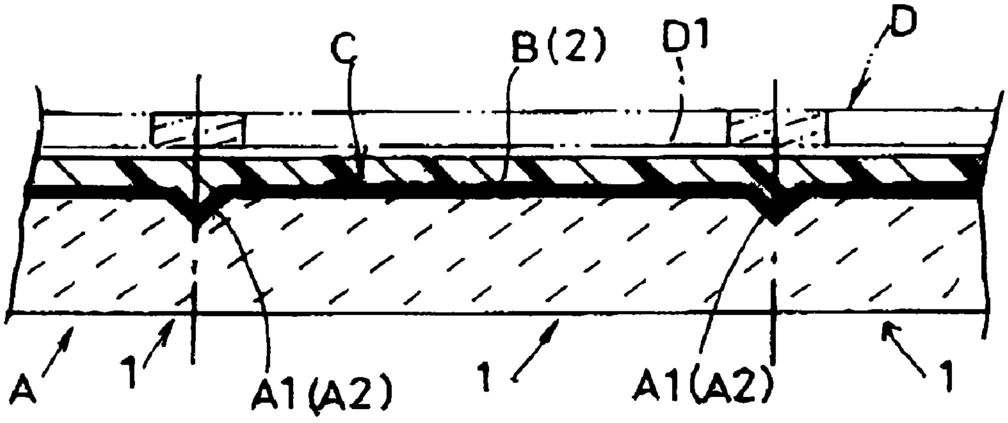
FIG. 6 is a sectional view showing the second step according to the conventional method.
Figure 7:
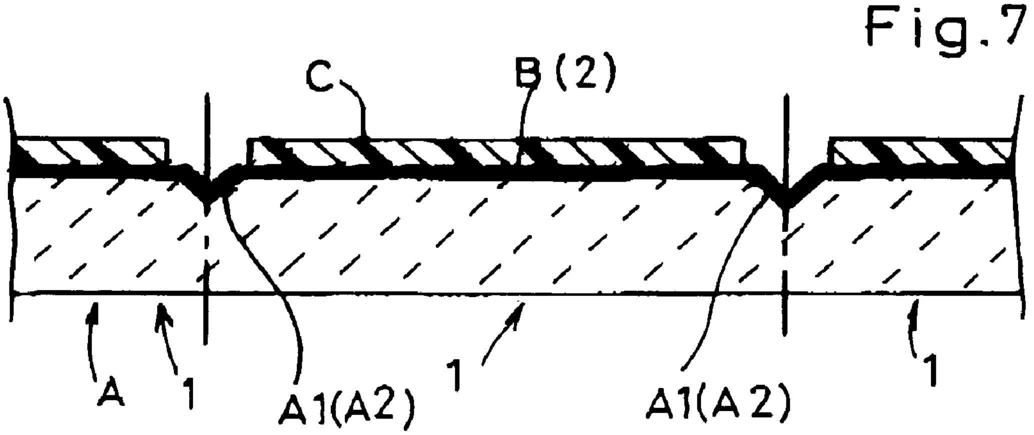
FIG. 7 is a sectional view showing the third step according to the conventional method.
Figure 8:
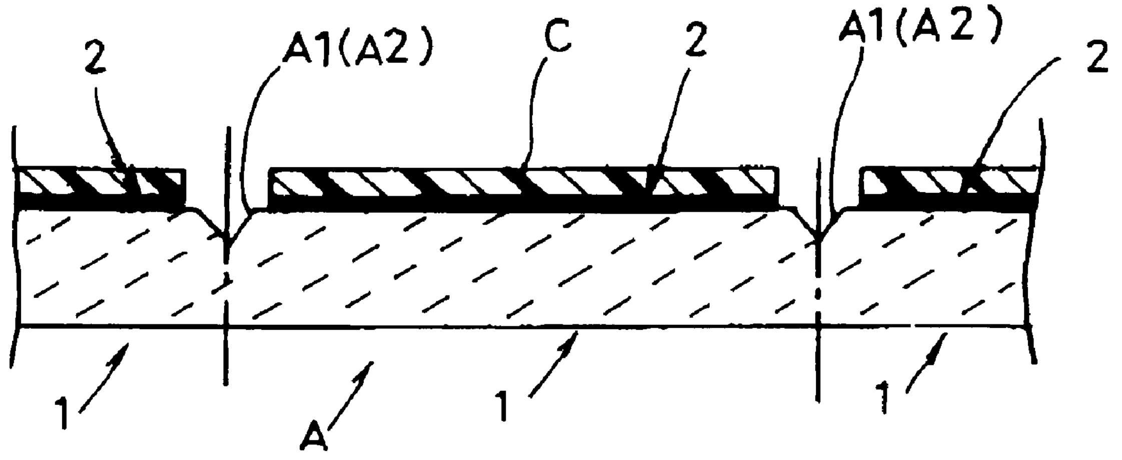
FIG. 8 is a sectional view showing the fourth step according to the conventional method.
Figure 9:
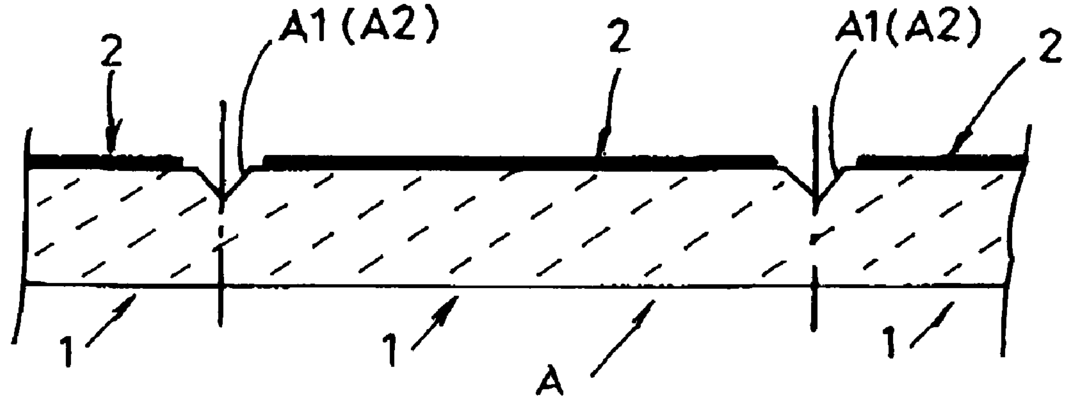
FIG. 9 is a sectional view showing the fifth step according to the conventional method.
Figure 18:
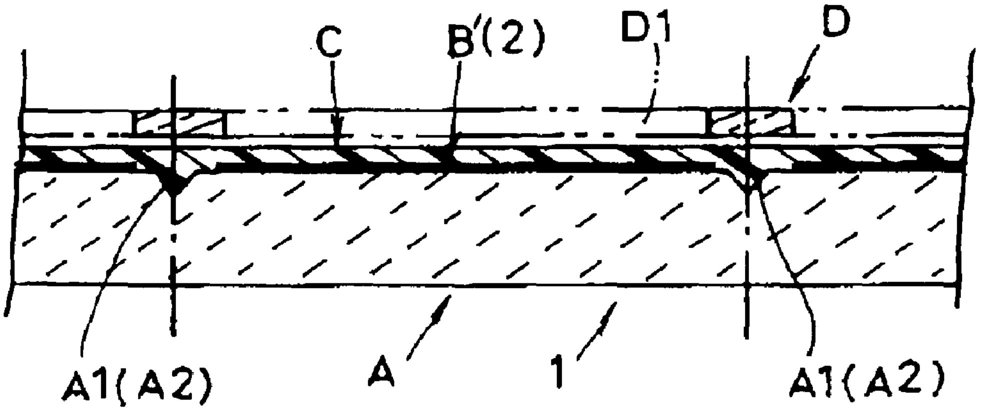
FIG. 18 is a perspective view showing the fourth step according to the second mode of embodiment of the present invention.

After the spattering process is over, as shown in FIG. 18 (same as in FIG. 6 according to the conventional method), a negative resist film C is formed to cover the entire surface of the material plate A. On this resist film C, a photo mask D is placed which has stencil patterns D1 or photographically transparent openings each for shaping a resistive element 2 on one of the chip substrates 1. The pattern is printed through a photochemical exposure process of the resist film C.

Next, a developing process is performed, in which the resist film C is soaked into a developing solution. In this process, as shown in FIG. 19, the resist film C is removed except for those potions patterned into the shape of resistive element 2 for each chip substrate 1.

Figure 19:
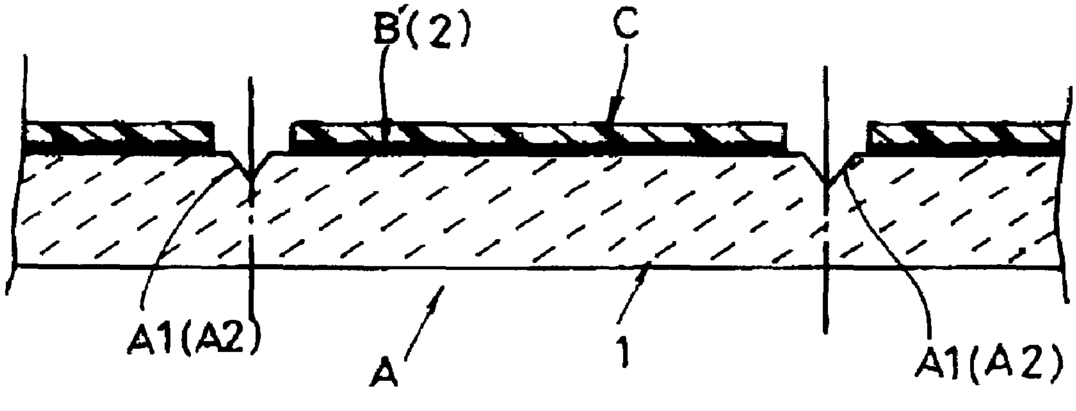
FIG. 19 is a perspective view showing the fifth step according to the second mode of embodiment of the present invention.

Next, as shown in FIG. 19, an etching process is performed in an etchant which is capable of removing the thin film of resistive element material B'. In this process, portions of the resistive element material B' which are not covered with the resist film C are dissolved and thereby removed, leaving beneath the resist film C resistive elements 2 which are patterned into a predetermined shape.

During this etching process, the resistive element material B' in the length wise breaking grooves A1 and the crosswise breaking grooves A2 of the material plate A is also removed. Since the film of material formed in the grooves are very thin or virtually nonexistent, it is possible to shorten the time necessary for the etching dramatically as compared to the conventional method where there is a thick deposit of the resistive element material in the lengthwise breaking grooves A1 and the crosswise breaking grooves A2.

Next, the resist film C is removed by dry ashing, and then the material plate A is cut along the lengthwise breaking grooves A1 and the crosswise breaking grooves A2, into individual chip substrates 1. The cutting is made in the same procedure as described for the first mode of embodiment.

Experiments conducted by the inventor of the present invention et al. revealed the following: Specifically, in the above two modes of embodiments, it is preferable that the region of the masking sheets E, E' which covers the lengthwise breaking grooves A1 and the crosswise breaking grooves A2 should have a width W, W' that is 1.1 through 4 times a width S, S' of the lengthwise breaking grooves A1 and the crosswise breaking grooves A2. The most preferable result was obtained when the width W, W' was two times the width S, S'. The width W, W' may be equal to the width S, S'; however, it is better to take into account some crosswise placement error when the masking sheet E, E' is placed over the material plate A. Thus, in consideration of the crosswise placement error, a minimum dimension for the width W, W' should preferably be: W, W'=1.1×S, S'. On the other hand, as the width W, W' becomes greater, so does a dimension L in FIG. 2, which is a distance from an end surface 1*a* to the resistive element 2 representing a wasteful region in the chip substrate 1. For this reason, a maximum dimension for the width W, W' should preferably be: W, W'=4×S, S'.

The masking sheets E, E' which are made of nonmagnetic material such as stainless steel have an advantage. Specifically, during the spattering, no film of the resistive element is formed on surfaces of the masking sheets E, E'. This enables repeated use of the masking sheets E, E'. Another advantage is that consumption of the material target is reduced.

Next, FIG. 20 through FIG. 24 show steps of a method according to a third mode of embodiment.

The method according to the third mode of embodiment includes, as does according to the first mode of embodiment, a step of preparing a material plate A which has a surface provided with lengthwise breaking grooves A1 and crosswise breaking grooves A2 for the purpose of cutting the substrate into a plurality of chip substrates 1. The lengthwise breaking grooves A1 and the crosswise breaking grooves A2 can be formed simultaneously when the material plate A is manufactured. Alternatively, the material plate A may not be formed with the lengthwise breaking grooves A1 and the crosswise breaking grooves A2 at the time of manufacture, and the lengthwise breaking grooves A1 and the crosswise breaking grooves A2 may be formed later using laser beams for example, on the surface of the material plate A.

Figure 20:
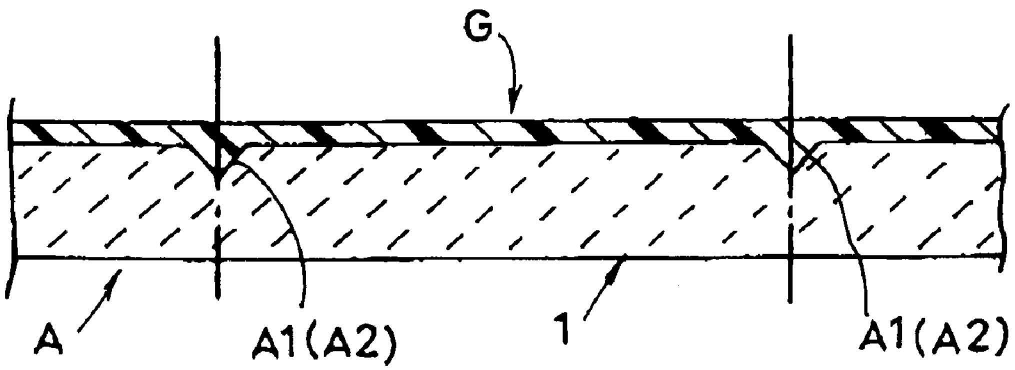
FIG. 20 is a sectional view showing the first step according to the third mode of embodiment of the present invention.

Next, as shown in FIG. 20, a positive resist film G is formed on the entire surface of the material plate A.

Figure 21:
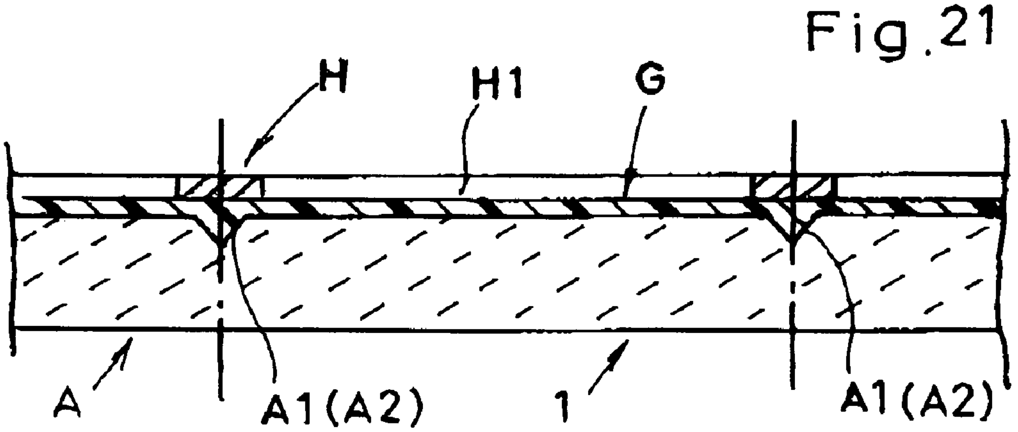
FIG. 21 is a sectional view showing the second step according to the third mode of embodiment of the present invention.

Next, as shown in FIG. 21, on this resist film G, a photo mask H is placed which has stencil patterns H1 or photographically transparent openings each having a shape of a resistive element 2 at a place corresponding to one of the chip substrates 1. The pattern is printed through a photochemical exposure process of the resist film G.

Figure 22:
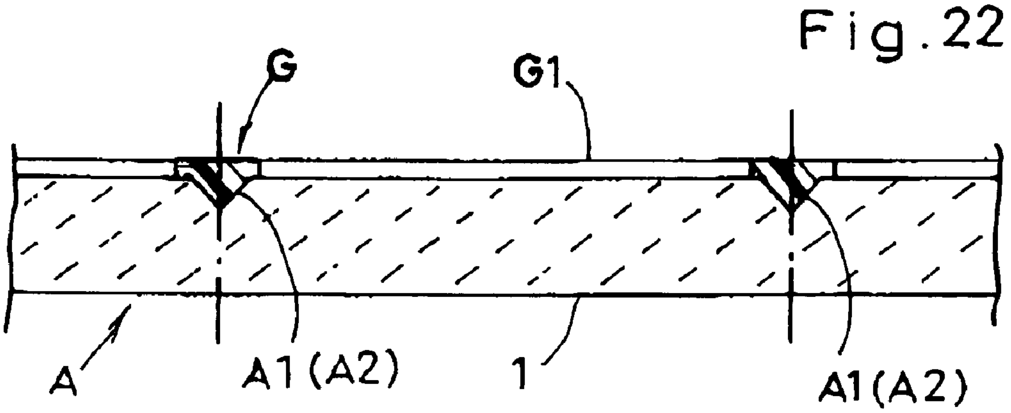
FIG. 22 is a sectional view showing the third step according to the third mode of embodiment of the present invention.

Next, as shown in FIG. 22, a developing process is performed, in which the resist film G is soaked into a developing solution. This process forms stencil patterns G1 each having a shape similar to that of the resistive element 2. On the other hand, the lengthwise breaking grooves A1 and the crosswise breaking grooves A2 are left as filled with the resist film G.

Figure 23:
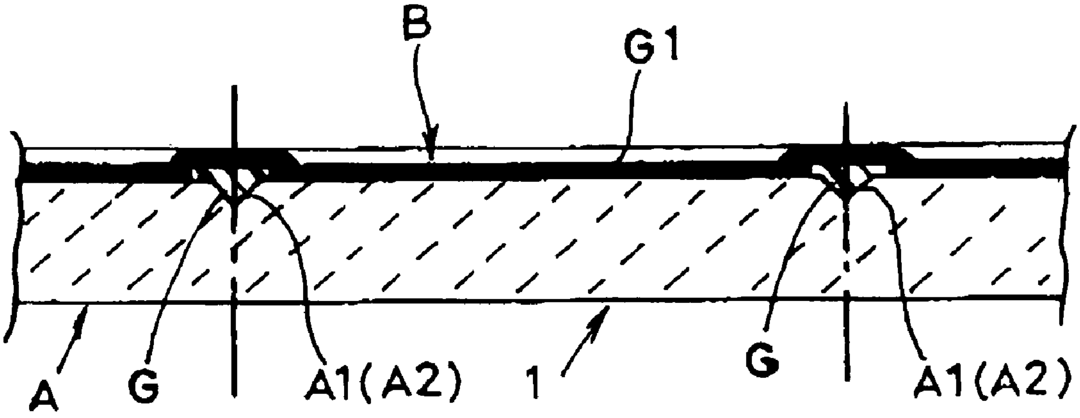
FIG. 23 is a sectional view showing the fourth step according to the third mode of embodiment of the present invention.

Next, the material plate A is placed entirely in a sealed container, and a thin-film process is performed to the surface of the material plate A by means of spattering or vacuum deposition, using a target provided by a resistive element material. As a result, as shown in FIG. 23, a film of the resistive element material B is formed in each of the stencil patterns G1 in the resist film G, as well as on the entire surface of the resist film G.

Figure 24:
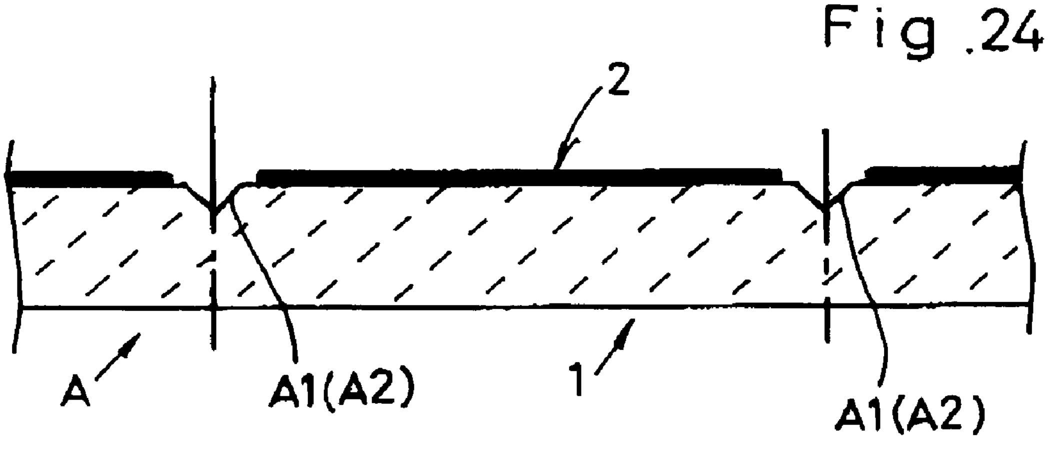
FIG. 24 is a sectional view showing the fifth step according to the third mode of embodiment of the present invention.

Next, the resist film G is removed from the material plate A. The removal is made by a plasma dry ashing method using e.g. oxygen, or by a wet method such as soaking into a remover. The removal of the resist film G leaves the surface of the material plate A with portions of the resistive element material B shaped by the stencil patterns G1 of the resist film G, at each predetermined place for the chip substrate 1. As a result, as shown in FIG. 24, each individual chip substrate 1 is now formed with a resistive element 2 of a predetermined shape.

Then, the material plate A is cut along the length wise breaking grooves A1 and the crosswise breaking grooves A2, into individual chip substrates 1. The cutting is made in the same procedure as described for the first mode of embodiment.

The method according to the third mode of embodiment enables to form the resistive element 2 of a predetermined shape on each chip substrate 1, without allowing the resistive element material B in the lengthwise breaking grooves A1 and crosswise breaking grooves A2, through the use of the resist film G which is formed on the material plate A before the spattering or other thin-film processes is performed. This enables to eliminate the etching process which is necessary in the conventional method.

Next, FIG. 25 through FIG. 32 show steps of a method according to a fourth mode of embodiment.

The method according to the fourth mode of embodiment includes, as does according to the first mode of embodiment method, a step of preparing a material plate A which has a surface provided with lengthwise breaking grooves A1 and crosswise breaking grooves A2 for the purpose of cutting the substrate into a plurality of chip substrates 1. The lengthwise breaking grooves A1 and the crosswise breaking grooves A2 can be formed simultaneously when the material plate A is manufactured. Alternatively, the material plate A may not be formed with the lengthwise breaking grooves A1 and the crosswise breaking grooves A2 at the time of manufacture, and the lengthwise breaking grooves A1 and the crosswise breaking grooves A2 may be formed later using laser beams for example, on the surface of the material plate A.

Figure 25:
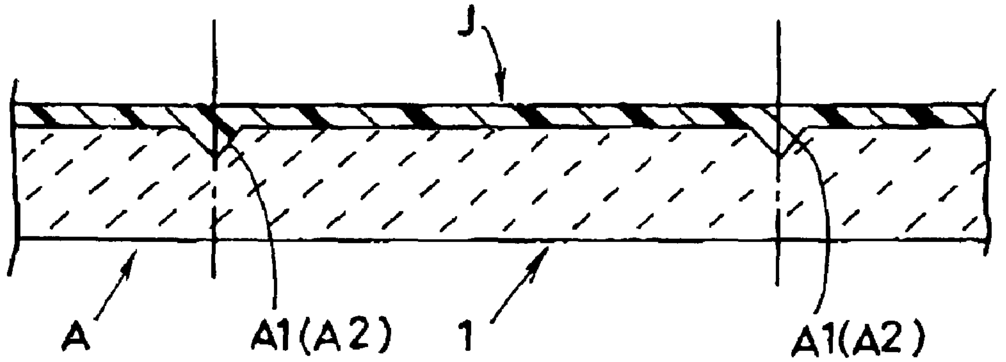
FIG. 25 is a sectional view showing the first step according to the fourth mode of embodiment of the present invention.

Next, as shown in FIG. 25, a positive resist film J is formed on the entire surface of the material plate A, as a filler which fills the lengthwise breaking grooves A1 and the crosswise breaking grooves A2.

Figure 26:
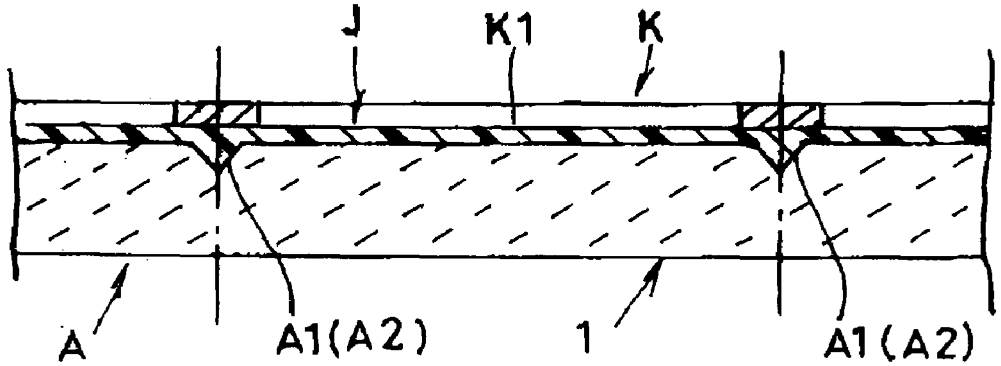
FIG. 26 is a sectional view showing the second step according to the fourth mode of embodiment of the present invention.

Next, as shown in FIG. 26, a photo mask sheet K, which is formed with photographically transparent openings including stencil patterns K1 each shaped to surround a resistive element 2 at a predetermined place on a corresponding one of the chip substrates 1, is placed on the resist film J. The pattern is printed through a photochemical exposure process in the resist film J.

Figure 27:
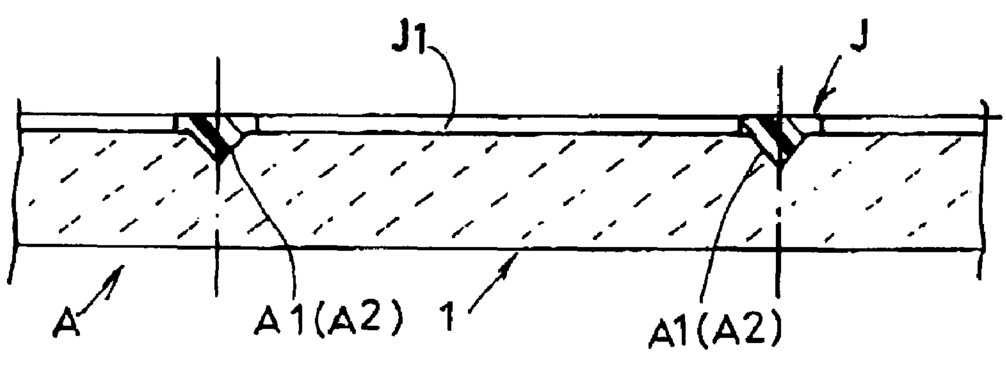
FIG. 27 is a sectional view showing the third step according to the fourth mode of embodiment of the present invention.

Next, a developing process is performed in which the resist film J is soaked into a developing solution. As shown in FIG. 27, this process leaves the resist film J with stencil patterns J1, each surrounding the resistive element 2 on one of the chip substrates 1. On the other hand, the lengthwise breaking grooves A1 and the crosswise breaking grooves A2 are kept as filled with the resist film J.

Figure 28:
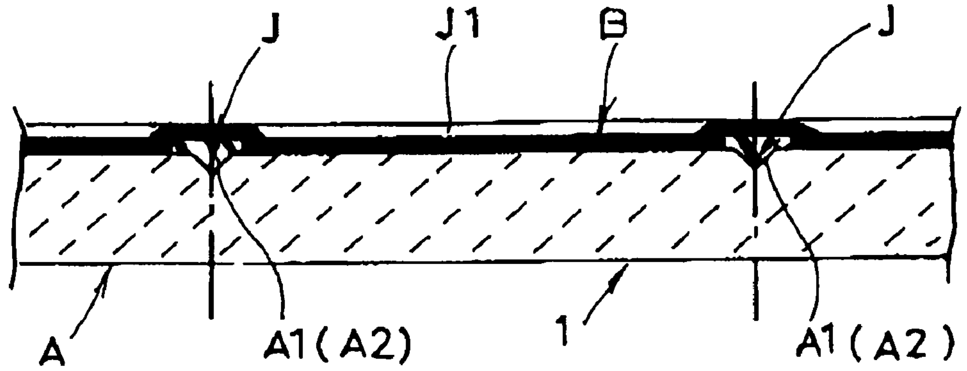
FIG. 28 is a sectional view showing the fourth step according to the fourth mode of embodiment of the present invention.

Next, the material plate A is placed entirely in a sealed container, and a thin-film process is performed to the surface of the material plate A by means of spattering or vacuum deposition, using a target provided by a resistive element material. In this process, as shown in FIG. 28, a film of resistive element material B for the resistive element 2 is formed in each of the stencil patterns J1 in the resist film J on the material plate A, as well as on the entire surface of the resist film J.

Figure 29:
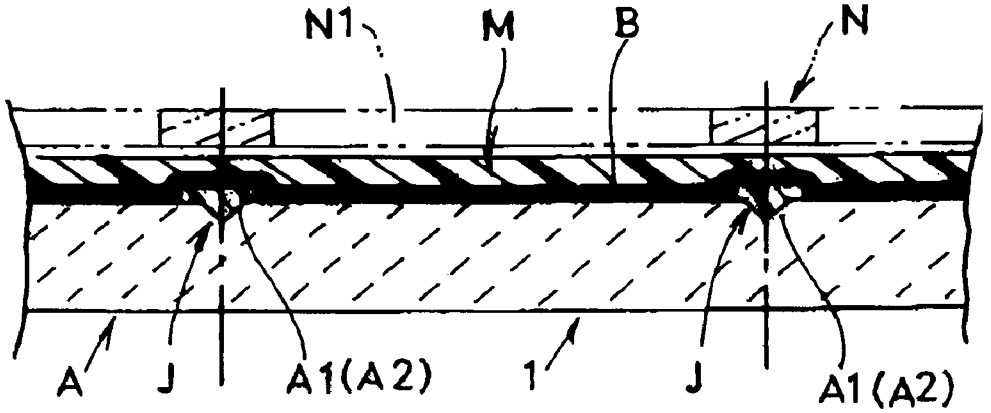
FIG. 29 is a sectional view showing the fifth step according to the fourth mode of embodiment of the present invention.

Next, as shown in FIG. 29, a negative resist film M is formed on the entire surface of the resistive element material B. Then, on this resist film M, a photo mask sheet N is placed which is formed with photographically transparent openings including stencil patterns N1 each shaped to similarly to the resistive element 2 on one of the chip substrates 1. The patterns are then printed through a photochemical exposure process.

Figure 30:
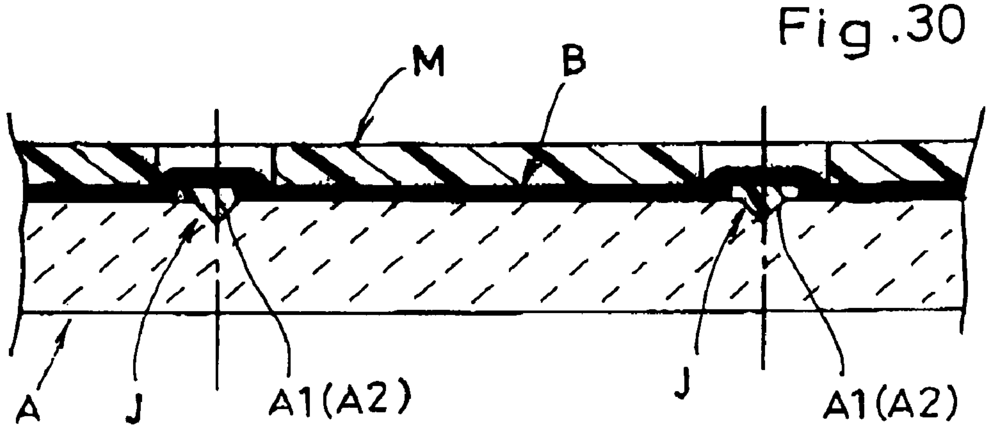
FIG. 30 is a sectional view showing the sixth step according to the fourth mode of embodiment of the present invention.

Next, a developing process of soaking into a developing solution is performed. In this process, as shown in FIG. 30, the resist film M is removed except for the portion patterned into the shape of resistive element 2 on each chip substrate 1.

Figure 31:
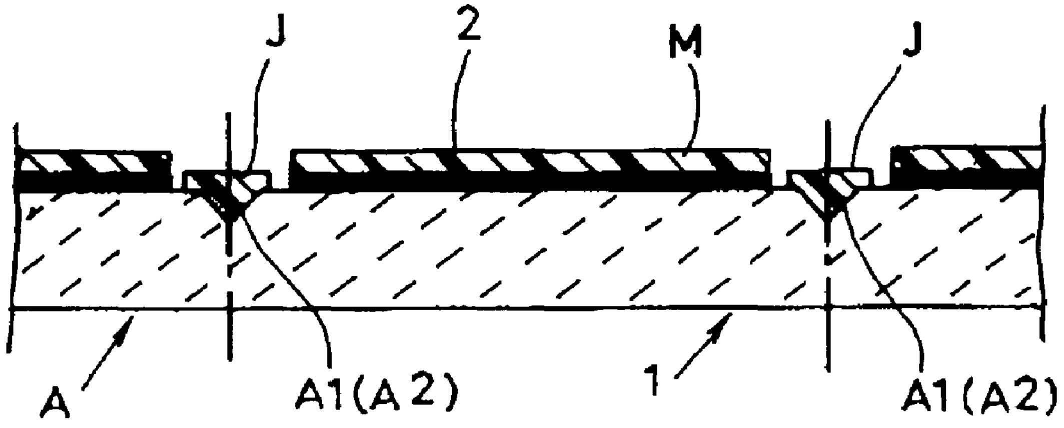
FIG. 31 is a sectional view showing the seventh step according to the fourth mode of embodiment of the present invention.

Next, an etching process is performed: The entire material plate A is soaked in an etchant which is capable of dissolving the resistive element material B. In this process, as shown in FIG. 31, portions of the resistive element material B which are not covered with the resist film M are dissolved and thereby removed, leaving beneath the resist film M resistive elements 2 which are patterned into a predetermined shape.

Figure 32:
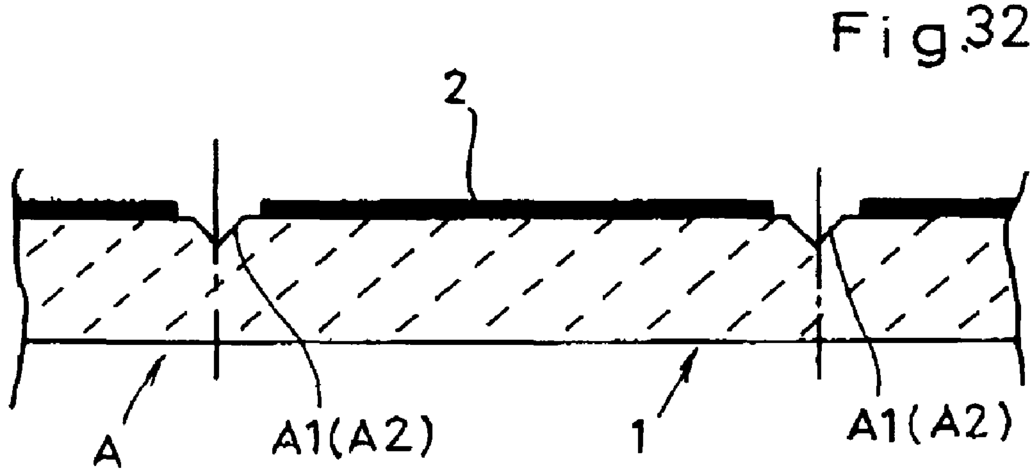
FIG. 32 is a sectional view showing the eighth step according to the fourth mode of embodiment of the present invention.

Next, as shown in FIG. 32, the resist film J as a filler, and the resist film M as a pattern maker are removed from the material plate A by dry ashing or wet method. In this removal process, either of the resist films J and M may be removed first before the other is removed, or both of the resist films J and M may be removed simultaneously. Still alternatively, removal of the filler resist film J may be made after the formation of resistive element material B by spattering or other thin-film processes.

Finally, the material plate A is cut along the lengthwise breaking grooves A1 and the crosswise breaking grooves A2, into individual chip substrates 1. The cutting is made in the same procedure as described for the first mode of embodiment.

In the method according to the fourth mode of embodiment, a surface region of the material plate A including at least lengthwise breaking grooves A1 and the crosswise breaking grooves A2 is formed with a removable filler (the resist film J) for filling the breaking grooves A1, A2, before the spattering or other thin-film processes is performed for depositing the resistive element material B on the material plate A. The filler (the resist film G) is removed after the thin-film process has been made. This eliminates the resistive element material B from forming in the lengthwise breaking grooves A1 and the crosswise breaking grooves A2 during the thin-film process, thereby enabling to reduce the time required for etching.

The invention claimed is:

1. A method of making a thin-film chip resistor comprising:

a step of preparing a material plate having a surface provided with lengthwise breaking grooves and crosswise breaking grooves for cutting the plate into a plurality of chip substrates; a step of forming a thin film of resistive element material on the surface of the material plate; a step of forming a resist film over the surface of the material plate to cover the thin film of resistive element material;

a first step of etching the resist film to remove portions of the resist film covering the lengthwise breaking grooves and the crosswise breaking grooves; a second etching step to remove portions of the resistive element material existing in the lenethwise breaking grooves and the crosswise breaking grooves; a step of removing remaining portions of the resist film; and a step of cutting the material plate into individual chip substrates;

wherein a masking sheet covering the lengthwise breaking grooves and the crosswise breaking grooves is placed on the material plate during the step of forming the thin-film of resistive material; and the second etching step is performed after the first step of etching the resist film and before the step of removing the remaining portion of the resist film.

2. The method of making a thin-film chip resistor according to claim 1, wherein a region in the masking sheet covering the lengthwise breaking grooves and the crosswise breaking grooves has a width 1.1 through 4 times a width of the lengthwise breaking grooves and of the crosswise breaking grooves.

3. The method of making a thin-film chip resistor according to claim 1, wherein the masking sheet is nonmagnetic.

* * * * *